United States Patent
Dautremont-Smith et al.

[11] Patent Number: 5,943,554
[45] Date of Patent: Aug. 24, 1999

[54] METHOD OF MAKING DISTRIBUTED FEEDBACK LASER HAVING SPATIAL VARIATION OF GRATING COUPLING ALONG LASER CAVITY LENGTH

[75] Inventors: William Crossley Dautremont-Smith, Orefield, Pa.; Todd Robert Hayes, Bernardsville, N.J.

[73] Assignee: Lucent Technologies Inc., Murray Hill, N.J.

[21] Appl. No.: 08/898,260

[22] Filed: Jul. 22, 1997

Related U.S. Application Data

[63] Continuation of application No. 08/581,636, Dec. 28, 1995, abandoned.

[51] Int. Cl.$^6$ .................................................. H01S 3/19
[52] U.S. Cl. .............................. 438/32; 438/29; 438/31; 372/96
[58] Field of Search .................................. 438/22, 29, 31, 438/32, 46, 47; 372/96

[56] References Cited

U.S. PATENT DOCUMENTS

| | | | |
|---|---|---|---|
| 5,020,072 | 5/1991 | Abe et al. | 372/96 |
| 5,274,660 | 12/1993 | Abe | 437/129 |
| 5,292,685 | 3/1994 | Inoguchi et al. | 437/129 |
| 5,329,542 | 7/1994 | Westbrook | 437/129 |
| 5,353,298 | 10/1994 | Makuta | 372/96 |
| 5,450,437 | 9/1995 | Shim et al. | 437/129 |
| 5,459,747 | 10/1995 | Takiguchi et al. | 372/96 |
| 5,474,952 | 12/1995 | Fujii | 437/63 |
| 5,502,741 | 3/1996 | Carroll et al. | 372/96 |
| 5,543,353 | 8/1996 | Suzuki et al. | 437/133 |

OTHER PUBLICATIONS

O. Albrektsen et al., "Gratings for Distributed Feedback Lasers Formed by Selective Epitaxial Growth," Proceedings of the International Conference on Indium Phosphide and Related Materials, Santa Barbara, Mar. 27–31, 1994. *Institute of Electrical and Electronics Engineers*, No. Conf. 6, Mar. 27, 1994, pp. 607–610, XP000473943.

"Selective MOCVD Epitaxy For Optoelectronic Devices", by R. Azoulay et al., *Journal of Crystal Growth*, vol. 55 (1981), pp. 229–234.

*Primary Examiner*—Charles Bowers
*Assistant Examiner*—Keith Christianson
*Attorney, Agent, or Firm*—David I. Caplan; Bruce S. Schneider; John M. Harman

[57] ABSTRACT

A distributed feedback (DFB) laser is made with a spatially graded optical coupling ($\kappa$) between its diffraction grating and its active layer by means of selective area epitaxial growth of the epitaxial layer from which the grating is formed. More specifically, the epitaxial layer is formed on a major surface of a semiconductor substrate on which a mask, such as a silicon dioxide mask, has been formed. The mask has a pair of segments spaced apart by a fixed distance, the segments having spatially variable widths. Advantageously the epitaxial layer has a refractive index that is different from that of the substrate at the operating wavelength of the laser. The epitaxial layer is then etched into stripes. In this way the heights of the resulting grating stripes will be spatially variable, and so will the coupling $\kappa$ between the grating and the active layer. In this way, the properties of the optical output of the laswer can be adjusted. Advantageously also, the spacer layer and the substrate have the same refractive indices at the operating wavelength of the laser, whereby accurate control over the depth of the etching is not required.

13 Claims, 1 Drawing Sheet

METHOD OF MAKING DISTRIBUTED FEEDBACK LASER HAVING SPATIAL VARIATION OF GRATING COUPLING ALONG LASER CAVITY LENGTH

This application is a continuation of application Ser. No. 08/581,636, filed on Dec. 28, 1995, now abandoned.

FIELD OF INVENTION

This invention relates to semiconductor lasers and more particularly to methods of making such lasers that have distributed feedback.

BACKGROUND OF INVENTION

A semiconductor laser is ordinarily made of Group III–V semiconductor materials. One particularly useful form of such a laser has distributed feedback ("DFB"). That is to say, optical feedback is built into the laser along its cavity length. For example, such feedback is supplied by means of a DFB diffraction grating whose stripes ("teeth") run perpendicular to the length (longitudinal direction) of the laser cavity. Such lasers, however, tend to suffer from spatial holeburning (spatial variation in optical gain saturation along the longitudinal direction) and from adiabatic chirping. That is to say, they suffer from relatively low gain near the highly reflecting mirror of the laser owing to spatial variation in gain saturation, and from non-symmetrical spectral intensity distribution around the spectral maximum. In turn, such holeburning and chirping cause, among other things, an undesired lack of single mode operation as well as an undesired lack of linearity of laser response to applied signals.

U.S. Pat. No. 5,329,542 teaches a semiconductor DFB laser in which improved single-mode behavior of such a laser is improved by reducing the feedback at or near one or both ends of the DFB grating. In particular, the feedback is reduced by reducing the coupling coefficient κ between the DFB grating and the optical cavity. This reducing in the coupling coefficient κ is achieved by spatially varying the depth of the grating's teeth and/or by spatially varying the spacing between adjacent teeth (while maintaining a fixed periodicity).

The aforementioned patent further teaches methods to achieve this spatially varying coupling κ. More specifically, the patent teaches a method of spatially varying either the depths or the spacing of the teeth. The method uses a crystallographically dependent (angular; non-vertical) chemical etching in combination with a patterned photoresist masking layer having a spatial duty cycle (i.e., variable tooth density) that varies in the longitudinal laser direction. This spatially varying duty cycle cannot be achieved by a relatively quick method—for example, a holographic interference exposure method—that produces a constant duty cycle over the entire surface in a single exposure; but it requires other, more time consuming methods. The resulting tooth depth is a critical parameter that determines κ. Such a method thus critically relies on the chemistry of the crystallographic etching required to produce the teeth. Consequently, the angle of etching, and hence the depth of the teeth, is very sensitive to the chemistry of the crystallographic etching. Therefore it is relatively difficult to control the average coupling resulting in the gratings made by such methods. It would therefore be desirable to have a method of making a DFB laser with a coupling κ that varies in the longitudinal laser direction but which does not rely on crystallographic etching and which can be achieved with a constant spatial duty cycle.

SUMMARY OF INVENTION

In accordance with the invention, a DFB laser is made by a sequence of steps comprising (a) forming, on a horizontal (xy) major surface of a semiconductor substrate, a masking layer having at least a pair of segments with opposing first and second surfaces oriented perpendicular to the major surface, whereby a space is formed between the segments whereat the major surface of the semiconductor substrate is exposed, the widths of the segments measured along a first (y) direction varying, advantageously monotonically, along a second (x) direction between two planes parallel to the first and second directions (for example, FIG. 1);

(b) growing, preferably by organo-metalic vapor phase epitaxy ("OMVPE"), an epitaxial semiconductive layer, advantageously having a different refractive index from that of the substrate, on the exposed major surface of the semiconductor substrate in the space between the segments of the masking layer, whereby the epitaxial layer has a thickness, measured in the vertical (z) direction, that varies—advantageously monotonically—with distance along the second (x) direction (for example, FIG. 2); and (c) patterning the epitaxial semiconductive layer into a multiplicity of stripes, such as by means of holographic interference photolithography and dry etching, each of the stripes having a geometrical component running along the major surface in the first (y) direction parallel to the first direction (for example, FIG. 3).

Step (c) is then advantageously followed by removing the phototlithographic mask and then epitaxially growing in succession a (bottom) spacer layer, an active layer, and a (top) cladding layer for the laser (illustratively, FIG. 3). Advantageously further, the laser is completed by subsequent further processing and epitaxial growth, as known in the art of making single-mode DFB lasers. This further processing advantageously includes vertical etching from the top of the laser down into the substrate ("mesa etching"). Advantageously this etching is performed such that the length of the entire portion of the laser located above the substrate has a constant length in the y direction, in order to define an optical waveguide that will support a single mode operation in the xy plane. In this way a grating layer is formed having stripes, composed of a material having a refractive index that is different from that of the substrate, whose heights measured along the vertical (z) direction spatially vary, advantageously monotonically, along the second (x) direction. As used herein the term "monotonically" includes the case in which the thickness does not vary in some regions along the second (x) direction.

Advantageously, the spacer layer has the same refractive index as that of the substrate. In this way precise control over the patterning (e.g., over the depth of the dry etching) of the epitaxial semiconductive layer is not required.

The coupling κ is dependent on the varying sizes (e.g., heights) of the stripes as well as on the refractive index of the grating layer relative to that of the spacer layer contiguous with the stripes. Because of the spatial variation in heights of the stripes of the grating layer, the coupling κ of the grating layer to the active layer will also spatially vary, as is desired.

The inventive method is adaptable to mass making of many DFB lasers, by means of suitable dicing (cleaving into pieces) of the substrate together with its superstructure that has been formed according to the above-described steps.

Advantageously, this dicing is followed by providing respective optical coatings of suitable reflectivities on the resulting yz facets.

Only for the sake of clarity, none of the FIGURES is drawn to any scale.

DETAILED DESCRIPTION

Figure 1:
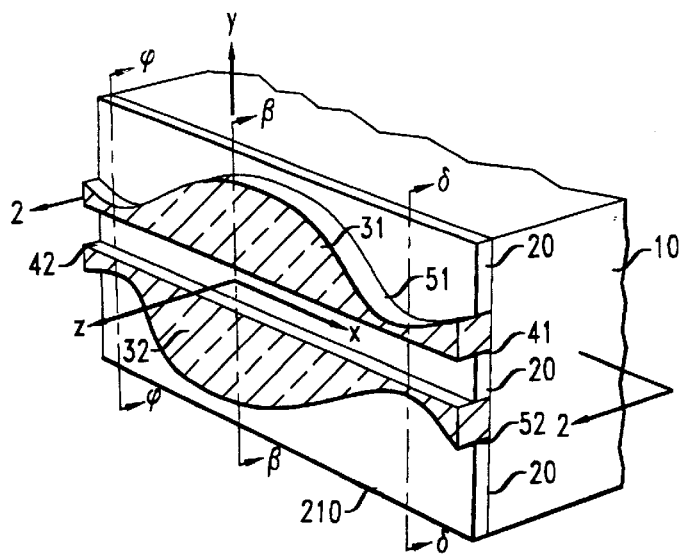
FIG. 1 shows a top perspective view, partly in cross section, of a multiplicity of DFB lasers in an early stage of their being made according to a specific embodiment of the invention.

As shown in FIG. 1, a single crystal semiconductive substrate 10 has a top major surface oriented parallel to the xy plane. Advantageously for mass making of many DFB lasers at the same time, the pattern of the structure shown in FIG. 1 has spatial periodicities in both the x and y directions—i.e., along the plane of the major surface of the substrate 10. Typically the substrate 10 is made of a Group III–V compound semiconductor, as known in the art. Silicon dioxide layer segments 31 and 32 are formed on the top major surface of the substrate 10, such as by a standard chemical vapor deposition technique. These layer segments 31 and 32 are patterned by standard masking and (wet or dry) etching, such that they have surfaces 41 and 42, respectively parallel to the xz plane. In addition, these layer segments 31 and 32 are patterned such that they have continuous (in the x direction), curvilinear vertical surfaces 51 and 52, respectively, opposing these planar vertical surfaces 41 and 42. The curvilinear vertical surfaces 51 and 52 are made such that the widths of the silicon dioxide layer segments 31 and 32 monotonically decrease in the x direction going from (imaginary) plane $\beta$ to (imaginary) planes $\alpha$ and $\gamma$. As used herein, the term "monotonically decrease" includes the case in which some portions monotonically non-increase. The heights (in the z direction) of the silicon dioxide layer segments 31 and 32 typically are made to be uniform and equal.

Figure 2:
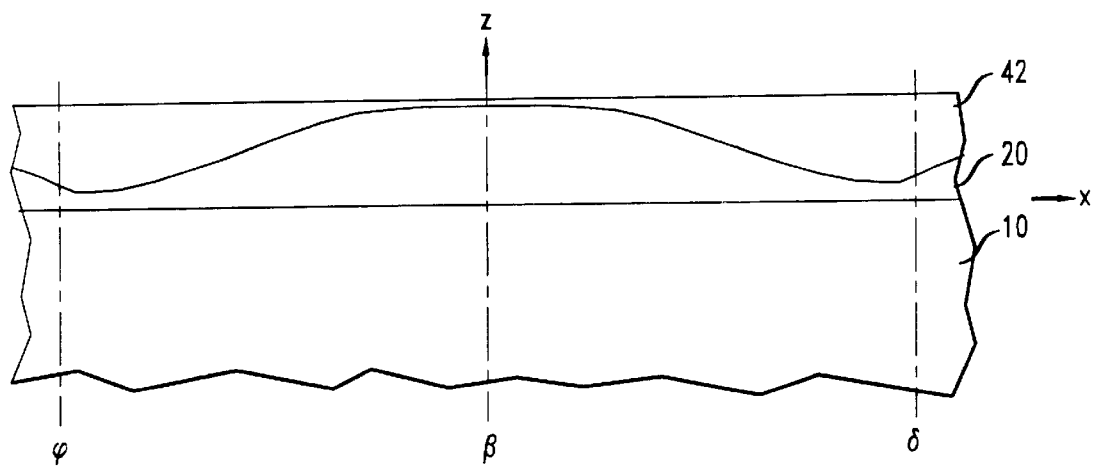
FIG. 2 shows a side, cross-sectional elevation view (taken along the cut indicated by the line 2—2 in FIG. 1) of the DFB lasers shown in FIG. 1.

Then (FIGS. 1 and 2), using the silicon dioxide layer segments 31 and 32 as masks, an epitaxial Group III–V semiconductor layer 20 (hereinafter, simply called "the epitaxial layer 20"), having a continuous (in the x direction) curvilinear top surface 210, is grown on the top surface of the substrate 10 by means of selective area growth. As used herein, the term "selective area growth" refers to a process in which the growth conditions are adjusted so that growth of any semiconductor material occurs only on surfaces of exposed semiconductor, as known in the art. The epitaxial layer 20 illustratively is an epitaxial quaternary Group III–V semiconductor layer or an epitaxial multiple-quantum-well Group III–V semiconductor layer. The epitaxial layer 20 advantageously has a refractive index or an effective refractive index at the DFB laser operating wavelength that differs from the of the substrate 10. As indicated in FIG. 2, this epitaxial layer 20 will have greater thicknesses (greater heights) measured in the z direction in the neighborhood of the plane $\beta$ than in the neighborhoods of the planes $\alpha$ and $\gamma$. Moreover, it will have intermediate, monotonically increasing heights between the planes $\alpha$ and $\beta$. These spatial variations in heights are attributable to the influence of the above-described monotonically decreasing widths of the silicon dioxide layer segments 31 and 32 between the planes $\alpha$ and $\beta$—i.e., monotonically increasing widths going from the plane $\alpha$ to the plane $\beta$. Therefore the epitaxial layer 20 has a monotonically increasing height going from the plane $\alpha$ to the plane $\beta$. As used herein, the term "monotonically increasing" thus includes the case in which some portions are monotonically non-decreasing.

Figure 3:
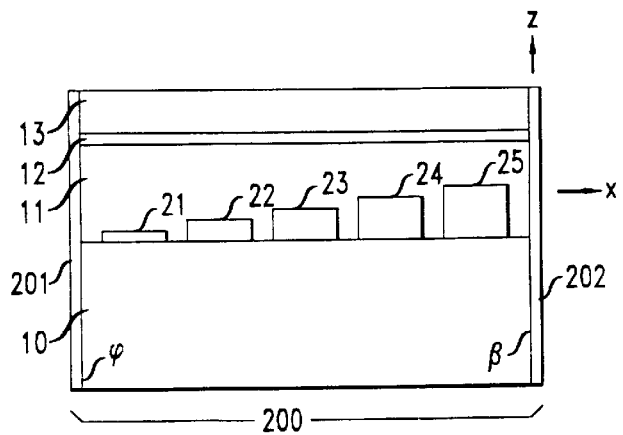
FIG. 3 shows a side elevation view of a single DFB laser in a later stage of its being made according to a specific embodiment of the invention.

Next, as indicated in FIG. 3, the epitaxial layer 20 is masked and vertically etched, preferably dry etched, using a standard patterned photoresist masking and vertical etching technique, whereby exemplary epitaxial stripes 21, 22, 23, 24, and 25 are formed. Only for the purpose of clarity, in FIG. 3 the number of stripes shown is reduced. Advantageously, in order to form a pattern in the photoresist mask, the photoresist is holographically exposed. Typically, the photoresist has a thickness of approximately 0.05 $\mu$m.

In a preferred embodiment, the layer 11 and the substrate have substantially equal refractive indices at the operating wavelength of the DFB laser 200 (FIG. 3) that is being made. In such an embodiment, the etching need not be material selective, that is, need not be dependent on the materials encountered in the etching, whereby the resulting etched grooves located between any of the adjacent stripes 21, 22, 23, 24, and 25 may penetrate into the substrate 10 by an amount that need not be controlled.

In any event, the epitaxial stripes 21, 22, 23, 24, and 25 are made to run parallel to the y direction, advantageously with mutually equal widths parallel to the x direction. However, the heights of these epitaxial stripes 21, 22, 23, 24, and 25 will monotonically increase with increasing x between the planes $\alpha$ and $\beta$, because these stripes derive from the epitaxial layer 20 that has a monotonically increasing height in the z direction going from the plane $\alpha$ to the plane $\beta$.

Then a spacer layer 11 is epitaxially grown to at least such a thickness that it fills in the grooves located between the stripes 21, 22, 23, 24, and 25. Next, an active layer 12 and a cladding layer 13 are epitaxially grown. These layers 11, 12, and 13 typically are made of Group III–V semiconductor material suitable for making a DFB laser 200 (FIG. 3). Advantageously the spacer layer 11 has the same refractive index as that of the substrate 10, so that precise control over the depth and selectivity of the etching of the stripes 21, 22, 23, 24, and 25 is not required.

The substrate 10 together with its superstructure including the epitaxial stripes 21, 22, 23, 24, and 25 is cleaved along the planes $\alpha$, $\beta$, and $\gamma$, as well as along planes parallel to the xz plane, to form many individual DFB lasers such as DFB laser 200 (FIG. 3). An optically highly reflecting coating 201 is formed on the plane $\alpha$ and an anti-reflection coating 202 is formed on the plane $\beta$. Finally, electrical contacts (not shown) are attached to the top and bottom surfaces of the DFB laser 200, as known in the art.

The epitaxial stripes 21, 22, 23, 24, and 25 form a DFB grating, as known in the art. The optical coupling $\kappa$ between the active layer 12 and this DFB grating layer will monotonically increase going from the plane $\alpha$ to the plane $\beta$, because of the increasing cross-section (yz) area of these stripes 21, 22, 23, 24, and 25, respectively, along the x direction. In addition, part of the variation of $\kappa$ among the stripes 21, 22, 23, 24, and 25 may be attributable to a variation of refractive index or of effective refractive index among these stripes caused by variation of composition of, or of effective bandgap of, the semiconductor material of these stripes.

EXAMPLE

By way of an illustrative example, the thickness (height in the z direction) of the silicon dioxide masking layer segments 31 and 32 typically are equal to approximately 0.3 μm. The length of the DFB laser 200 along the x direction typically is equal to approximately 0.4 mm. The epitaxial stripes 21, 22, 23, 24, 25, etc., all have the same width typically equal to approximately 0.10 or 0.12 μm in the x direction. More generally, the width of the stripes 21, 22, 23, 24, 25, etc., in the x direction typically is equal to approximately 30 percent-to-70 percent of the spatial periodicity (in the x direction) of the grating formed by these stripes. In addition, the stripes 21, 22, 23, 24, 25, etc., have a spatial periodicity typically equal to approximately 0.20 μm or 0.24 μm, respectively, for a DFB laser 200 operating at a wavelength of 1.31 μm or 1.55 μm, respectively. Thus there typically are approximately two thousand epitaxial stripes 21, 22, 23, 24, 25, etc., in the DFB laser 200. The width of the substrate 10 of the DFB laser 200 in the y direction is typically equal to approximately 0.25 mm (=250 μm). However, by means of vertical etching not only the stripes 21, 22, 23, 24, 25, etc., but also the layers 11, 12, and 13 have a width in the y direction that typically is approximately equal to only 1 μm.

Although the invention has been described in detail in terms of a specific embodiment, various modifications can be made without departing from the scope of the invention. For example, instead of, or in addition to, the silicon dioxide layer segments 31 and 32 having planar vertical opposing surfaces 41 and 42, they can have curvilinear vertical opposing surfaces like 51 and 52.

Instead of silicon dioxide, other materials can be used for the masking layer segments 31 and 32. Such other materials include, for example, silicon nitride or amorphous silicon. In addition, such other materials include other dielectric layers that inhibit the growth of the epitaxial semiconductor layer 20 on their surfaces but that enable the diffusion on their surfaces of the reacting chemical species into the exposed semiconductor regions where the epitaxial layer 20 is growing.

Also, the surfaces 51 and 52 can have stepwise y-discontinuities along the x direction. In such cases, the contour of the surface 210 will not be as discontinuous as the surfaces 51 or 52 because of the diffusion, on the surfaces of the masking layer segments 31 and 32, of the semiconductor material being deposited.

Finally, as an alternative, immediately after the epitaxial growth of the epitaxial layer 20, a thin epitaxial layer (not shown), advantageously having the same refractive index as that of the substrate 10, is grown on the top surface 210. In this way, as known in the art, the quality of the stripes 21, 22, 23, 24, 25, etc., is maintained.

What is claimed is:

1. A method of making a laser comprising the steps of
   (a) forming, on a horizontal major surface of a semiconductor substrate, a masking layer having at least a pair of segments with opposing first and second surfaces perpendicular to the major surface of the substrate, whereby a space is formed between the segments whereat the major surface of the semiconductor substrate is exposed, the widths of the segments measured along a first direction varying with distance along a second direction;
   (b) growing an epitaxial semiconductive layer on the exposed major surface of the semiconductor substrate in the space between the segments of the masking layer, whereby the epitaxial layer has a thickness, measured in the vertical direction, that varies in a direction parallel to the second direction;
   (c) patterning the epitaxial semiconductive layer into a multiplicity of stripes, each of which has a geometrical component running along the major surface in the first direction parallel to the first direction; and
   epitaxially growing a spacer layer having a refractive index that is substantially equal to that of the substrate.

2. The method of claim 1 followed by epitaxially growing in succession, an active layer and a cladding layer.

3. The method of claim 2 further comprising the step of dicing the substrate to form individual lasers.

4. The method of claim 3 followed by forming an anti-reflecting coating on a first resulting surface of at least one of the individual lasers and a highly optically reflecting coating on a second resulting surface opposed to the first resulting surface.

5. The method of claim 1, 2, 3, or 4 in which during step (b) the epitaxial semiconductive layer being grown has a refractive index that is different from that of the substrate at an operating wavelength.

6. The method of claim 1 in which the epitaxial layer is a Group III–V quaternary compound.

7. The method of claim 6 followed by epitaxially growing in succession a spacer layer, an active layer, and a cladding layer.

8. The method of claim 7 further comprising dicing the substrate to form individual lasers.

9. The method of claim 8 followed by forming an anti-reflecting coating on a first resulting surface of at least one of the individual lasers and a highly optically reflecting coating on a second resulting surface opposed to the first resulting surface.

10. The method of claim 1 in which the epitaxial layer is a Group III–V multiple quantum well layer.

11. The method of claim 10 followed by epitaxially growing in succession a spacer layer, an active layer, and a cladding layer.

12. The method of claim 11 further comprising dicing the substrate to form individual lasers.

13. The method of claim 12 followed by forming an anti-reflecting coating on a first resulting surface of at least one of the individual lasers and a highly optically reflecting coating on a second resulting surface opposed to the first resulting surface.

* * * * *